Figure 1:
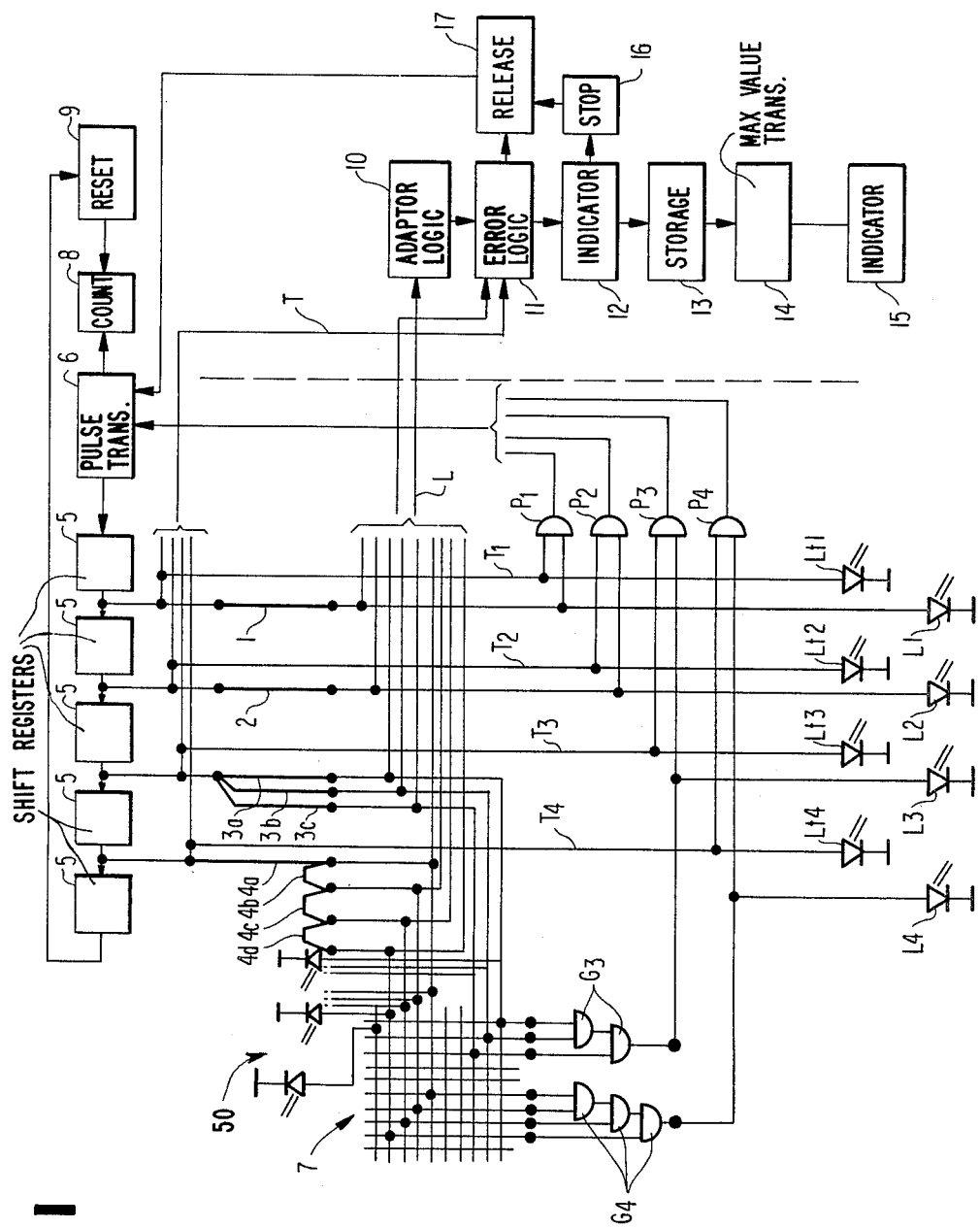

United States Patent [19]

Schäling

[11] 4,271,388
[45] Jun. 2, 1981

[54] APPARATUS INCLUDING A SHIFT REGISTER FOR TESTING DIFFERENT TYPES OF CABLE SETS

[75] Inventor: Wolfgang Schäling, Mannheim, Fed. Rep. of Germany

[73] Assignee: Daimler-Benz Aktiengesellschaft, Stuttgart, Fed. Rep. of Germany

[21] Appl. No.: 908,728

[22] Filed: May 23, 1978

[30] Foreign Application Priority Data

May 25, 1977 [DE] Fed. Rep. of Germany ....... 2723536

[51] Int. Cl.³ ............................................ G01R 31/02
[52] U.S. Cl. ........................................ 324/51; 324/66
[58] Field of Search ................. 324/73 R, 73 AT, 51, 324/66, 54; 179/175.3 R

[56] References Cited

U.S. PATENT DOCUMENTS 3,699,438  10/1972  Webb ..................... 324/51

FOREIGN PATENT DOCUMENTS 7408886  3/1974  France ................... 324/73 R

Primary Examiner—Gerard R. Strecker
Attorney, Agent, or Firm—Craig & Antonelli

[57] ABSTRACT

An installation for testing different types of cable sets, especially motor vehicle cable sets with interconnected conductors and with adaptors for non-fixed polarity, in which a shift register is provided with one output each for each individual conductor of each conductor connection; each output is connected with the input of the associated conductor or of the associated conductor connection and with a synchronizing line belonging to this conductor or the conductor connection.

12 Claims, 2 Drawing Figures

APPARATUS INCLUDING A SHIFT REGISTER FOR TESTING DIFFERENT TYPES OF CABLE SETS

The present invention relates to an installation for testing different types of cable sets, especially of motor vehicle cable sets with interconnected conductors and with adaptors for non-fixed polarity. A number of testing devices are known in the art which are able to test cable sets consisting of individual conductors or lines for interchange, interruption (open-circuit) and short-circuit of the conductors. Such an apparatus was proposed, for example, in the German Patent Application No. P 26 09 047.

However, all of such apparatus are unsuited for the testing of cable sets which—as for example numerous bus cable sets—include a large number of interconnected conductors and adaptors for non-predetermined or non-fixed polarity. Such cable sets are made either in larger numbers for series constructions or by individual manufacture for special customer wishes.

It is the aim of the present invention to provide an installation which is capable to test aforementioned cable sets and to recognize thereby as correct permissive polarities of adaptors, to be rapidly changeable to other cable sets and to be usable also for spot-checking of cable set lots.

The underlying problems are solved according to the present invention in that a shift register with one output each for each individual conductor or each conductor connection is provided, whereby each output is connected with the input of the coordinated conductor or the coordinated conductor connection and with a synchronizing or clock pulse line belonging to this conductor or to this conductor connection, and in that a cross bar distributor or matrix with a cross-over point for at least each output of all interconnected conductors and adjoining the same plug-in type logic gate circuits for the analysis and resolution of the interconnections are provided, and in that for each individual conductor and for each conductor connection a test gate is provided, to the inputs of which are adapted to be fed, on the one hand, the output of the conductor, respectively, the output of the logic gate circuit coordinated to the conductor connection and, on the other, the coordinated synchronizing line, in that an optical indication is coordinated to each input of the test gate and in that the outputs of the test gates lead to the input of the shift register, and/or in that an adaptor logic system for testing the permissibility of polarities and an error logic system for determining short-circuits, interchanges and open-circuits with a storage device for the number of the occurred errors are provided, and in that for spot-check testing of cable set lots a maximum value transmitter for the permitted error number is provided which, upon exceeding the maximum value, produces signals for a blocking of the lot.

Accordingly, it is an object of the present invention to provide a device for testing different types of cable sets which avoids by simple means the aforementioned shortcomings and drawbacks encountered in the prior art.

Another object of the present invention resides in a testing apparatus for testing different types of cable sets consisting of a large number of connectors, respectively, interconnected conductors and provided with adaptors for non-predetermined polarity.

A further object of the present invention resides in a testing apparatus of the type described above which is capable of recognizing as correct permitted polarities of adaptors and which can be rapidly changed over to other cable sets.

Figure 2:
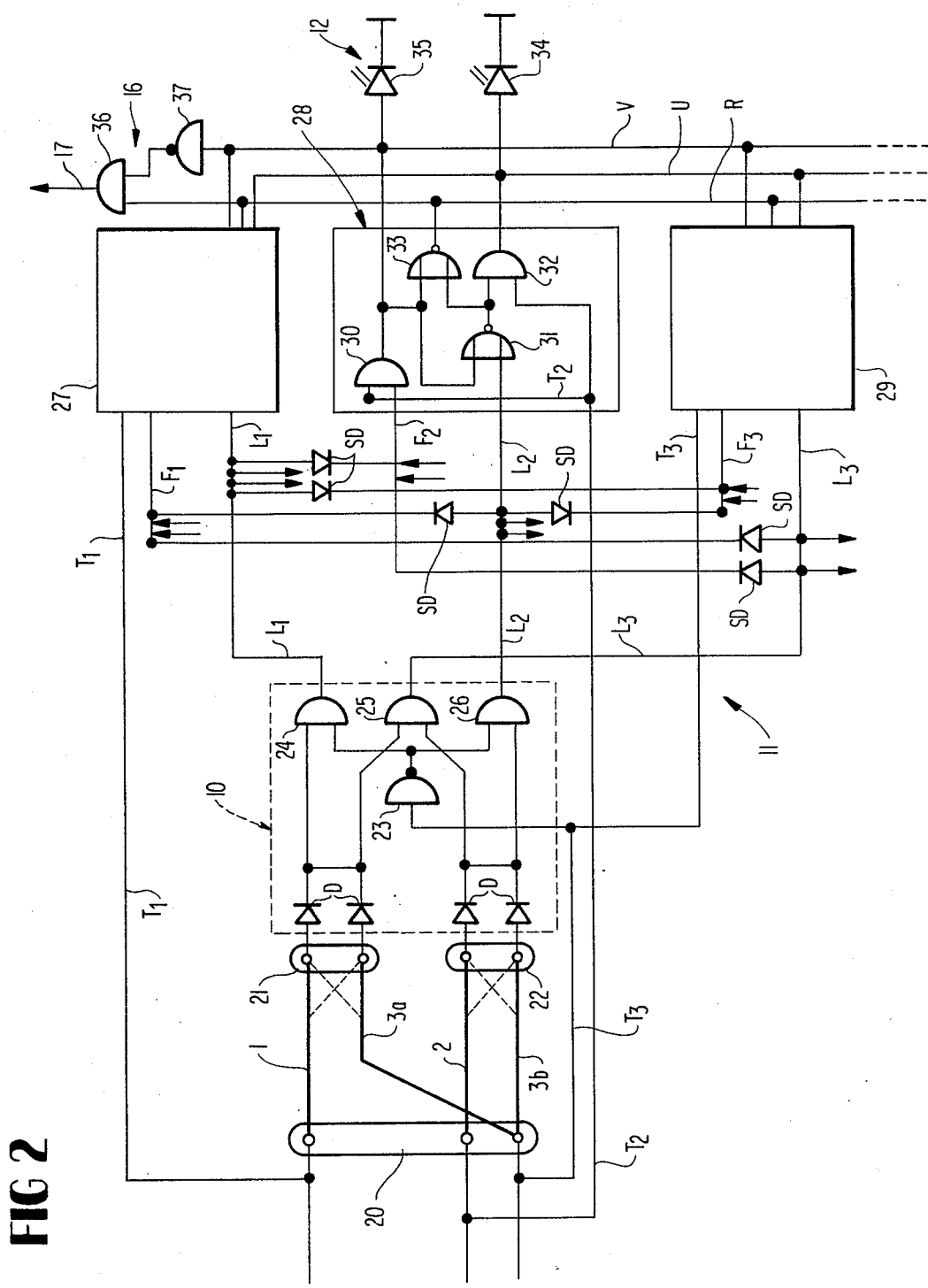

These and other objects, features and advantages of the present invention will become more apparent from the following description when taken in connection with the accompanying drawing which shows, for purposes of illustration only, one embodiment in accordance with the present invention and wherein:

FIG. 1 is a schematic block diagram of the overall circuit of the testing installation according to the present invention; and FIG. 2 is a schematic circuit diagram of one embodiment of an adaptor and error logic system in accordance with the present invention.

Referring now to the drawing wherein like reference numerals are used throughout the two views to designate like parts, and more particularly to FIG. 1, this figure illustrates a schematic over-all circuit diagram of the installation by reference to a small cable set which consists, for the sake of simplicity and clarity, of two individual conductors or lines 1 and 2 as well as of two interconnected conductors or lines, on the one hand, with three connections designated by reference numerals 3a, 3b and 3c and, on the other hand with four connections designated by reference numerals 4a, 4b, 4c and 4d. A shift register 5 which is shifted manually from a pulse transmitter 6 periodically or by pulses of the test gates as described below, takes over the serial questioning or testing of the cable set. Its successive outputs are connected with the coordinated connections of the input adaptors of the conductors 1 to 4 and with the corresponding synchronizing lines T1 to T4. The synchronizing or clock pulse lines T1 to T4 lead to an error-logic device 11 to be described more fully hereinafter as well as to one input each of the coordinated test gates P1 to P4 and to the coordinated light diodes Lt1 to Lt4. The connections of the output adaptors of the interconnected conductors 3a to 3c and 4a to 4d lead to the inputs of a cross bar distributor or matrix generally designated by reference numeral 7, whereby at the coordinated outputs of the distributor or matrix 7 a logic gate circuit either of the plug-in type or of the switchable type, which, for example, is composed of AND elements, is coordinated to each interconnected conductor set. The gate circuit G3 is coordinated to the conductors 3a to 3c while the gate circuit G4 is coordinated to the conductors 4a to 4d. The logic gate circuit produces a "1" signal, when all output adaptors of the interconnected conductor are connected with the associated shift register output and further conduct the "1" signal thereof, i.e., are correctly connected and are neither short-circuited nor open-circuited. The outputs of the logic gate circuits G3 and G4 are connected with the respective second inputs of the test gates P3 and P4 and with the light diodes L3 and L4. The connections of the output adaptors of the conductors 1 and 2 are connected with the corresponding second inputs of the test gates P1 and P2 and with the light diodes L1 and L2. The connections of the output adaptors of all conductors 1 to 4d additionally lead to the adaptor logic device 10.

The system so far described and illustrated in FIG. 1 to the left of the dash line is utilized for testing individual cable sets. After the cable set is connected, and after the cross-bar distributor or matrix 7, the logic gates G3 and G4, the test gates P1 to P4 and the light diodes L1 to L4 and Lt1 to Lt4 are correspondingly connected or plugged-in, the pulse transmitter 6 is started manually. A "1" signal thus appears at the first output of the shift register 5 which reaches the light diodes L1 and Lt1 and the inputs of the test gate P1 by way of the conductor 1—insofar as the latter is not connected interchanged, is not short-circuited or is not open-circuited—and by way of the synchronizing line T1. A "1" signal also appears at the test gate P1, of an AND circuit, which is applied to the pulse transmitter for enabling the further shifting of the shift register 5. If, for example, the inputs or outputs of the conductors 1 and 2 are interchanged with each other, then the lights Lt1 and L2 light up and the test gate P1 is blocked until either the error is eliminated or the pulse transmitter is further operated manually. In case of an interruption, i.e., open-circuit of the conductor 1, only the light Lt1 lights up, and with a short-circuit no light diode lights up. The coordination to the cable set can be recognized by way of the symmetrical arrangement of the alpha numerical light diode field.

The position of the interchanged conductor can also be read off in case of interconnected conductors by way of a small light diode field 50 which is directly coordinated to all cross bar distributor or matrix inputs. In all of these cases, the shift register 5 is not automatically shifted-on since the corresponding test gate remains blocked.

After passing through all necessary locations of the shift register 5, the pulse transmitter 6 is turned off and the end of the testing operation is indicated in a reset unit 9 in a conventional manner (not shown). This can take place in a counter 8 with digital indication which is provided for the second part of the installation according to the present invention.

The second part of the installation according to the present invention is illustrated in FIG. 1 to the right of the dash line; the synchronizing lines T, i.e., T1 to T4 and the outputs L of the conductors or lines 1 and 2 as well as of the conductor or line connections 3a, 3b and 3c as well as 4a, 4b, 4c and 4d are fed to the second part. If conductors are combined into adaptors with permitted polarity or nonpolarized, i.e., if the adaptor of the cable set can be later on connected correctly or incorrectly, for example, a connection with a current-conducting conductor and a ground conductor for an incandescent lamp, then the outputs of these conductors lead to an adaptor logic 10 which does not register this polarity as error. The outputs of the adaptor logic 10 as well as the outputs of the remaining conductors and the synchronizing conductors T lead to the error logic 11 which tests the individual conductors, respectively, conductor connections for interchange, interruption (open-circuit) and short-circuit. If no error exists, a pulse is given off by way of the release 17 to the pulse transmitter 6 for the further shifting of the shift register 5. If, in contradistinction thereto, an error occurs, the error is indicated in the error indication 12 and the release 17 is blocked by way of a stop circuit 16 of conventional construction. The occurred errors are registered, respectively, added in an error storage device 13 and the error number is compared with the error number predetermined in a maximum value transmitter 14. Thereupon, the testing can be continued manually by push-button actuation or automatically. As soon as the number of the occurred errors reaches this predetermined error number an indicating device 15 is set into operation and possibly the release 17 is blocked.

This second part of the test circuit is particularly suited for spot-check testing of cable set lots, especially for series-manufactured cable sets. The number of errors which is no longer permitted is stored in the maximum value transmitter 14. Thereupon, all cable sets of the lot, for example, fifty pieces are tested. If the stored error number is reached thereby, then this lot is blocked by means of the indicating device 15. Therebeyond, the adaptor logic is accommodated in a separate testing apparatus input set which serves simultaneously as receiving adaptor for the cable set to be tested. In other words, the testing apparatus of the adaptor logic is accommodated in a part of the system, located in front thereof, which is also provided with receiving adaptors for the cable sets to be tested. The connection to the basic apparatus takes place by way of a standardized connection. This means that the universal basic logic system is in the testing apparatus itself and the special electrical and mechanical connecting conditions are taken into consideration in the testing apparatus input set.

With changes or new parts, no changes are necessary in the testing apparatus but only the respective individual testing apparatus input set is correspondingly changed and prepared without the occurrence of any standstill or down periods at the testing apparatus itself.

FIG. 2 illustrates one schematic embodiment for the adaptor logic 10, for the error logic 11 as well as for the error indication 12, the stop circuit 16 and the release 17 by reference to a cable set portion of FIG. 1, consisting of the conductors 1, 2, 3a and 3b. This cable set portion has on the input side a three-pole adaptor 20 and terminates on the output side in a two-pole adaptor 21 for the conductors 1 and 3a and in a two-pole adaptor 22 for the conductors 2 and 3b. The adaptors 21 and 22 have no predetermined or fixed polarity (nonpolarized), i.e., they can also be plugged into the associated socket in the reverse manner, which is illustrated by the crossed-over, dash lines. For this reason, an adaptor logic generally designated by reference numeral 10 is series-connected with the cable set portion, which is to prevent that an error is registered with an incorrect (reversed), but permitted polarity.

The adaptor logic 10 consists for this application of four diodes D, of three AND elements 24 to 26 and of an inverter 23 which are interconnected as shown in the circuit diagram of FIG. 2. One diode is coordinated to each output of the adaptors 21 and 22 which is conductive in the direction toward the AND elements 24 to 26. The cathodes of the diodes coordinated to the same adaptor are short-circuited and connect with each other one input each of the AND elements 24 and 25, respectively, 25 and 26. The two other inputs of the AND elements 24 and 26 are also connected with each other and with the output of the inverter 23 whose input is connected with the synchronizing line T3. It will now be tested by the adaptor logic 10, whether conductor 1, respectively, 2 or 3 from the shift register output connected with the synchronizing line T1, respectively, T2 or T3 has a contact (electrical connection) with one of the two connections of the adaptor 21 (respectively, with one connection each of the two adaptors in case of line 3). At first, the conductor 1 receives a "1" signal from the coordinated shift register. This "1" signal reaches one input each of the AND elements 24 and 25 by way of the adaptor 21 and one of the two diodes D.

Since the conductor 3 and the synchronizing line T3 at this time carry a 0 signal, a "1" signal is present at the output of the inverter 23 and therewith also at the second input of the AND element 24 so that the latter is conductive and line L1 (identical with the one leading to the light diode L1 in the first part of the circuit) also carries a "1" signal. The same testing takes place in connection with the line or conductor 2 after a further shifting of the shift register 5, whereby the conductor L2 then carries a "1" signal. During the testing of the lines 3a and 3b, one input each of the AND elements 24 and 26 and both inputs of the AND element 25 receive a "1" signal so that the conductor L3 also receives "1" signal. The two AND elements 24 and 26 are blocked by way of the synchronizing line T3 and the inverter 23 whose output now carries a 0 signal. The adaptor logic 10 is correspondingly interconnected for other cable set configurations, as known to a person skilled in the art. During the testing of individual cable sets with the installation illustrated in the left part of FIG. 1, an adaptor logic of the type described above may also be connected to the corresponding outputs of the corresponding lines for the admissibility of non-fixed polarities.

The error logic generally designated by reference numeral 11 is connected to the adaptor logic 10. During the testing of individual conductors of the cable set, the adaptor output thereof is connected directly to the error logic 11. One circuit 27, 28, 29 . . . is provided for each individual line or conductor, respectively, for each interconnected line, i.e., therefore for each shift register output, respectively, for each synchronizing line, which is illustrated in greater detail in the block 28 and is identical for all lines. It consists of two AND elements 30 and 32 and of two NOR elements 31 and 33; it includes three inputs, namely, one input T for the synchronizing line, one input L for the line to be tested and one extraneous line input F. The respective index number thereby refers to the associated line to be tested. The inputs L and F of all circuits are so coupled with each other by way of diodes SD that a "1" signal at one input Lx reaches the extraneous line inputs of all other circuits with the exception of its own extraneous line input Fx. The diodes which come from further circuits connected to the circuits 27, 28, 29 (not shown) and which corresponds to such circuits in accordance with the conductors to be tested or which lead to such further circuits (not shown) are symbolically indicated by arrows, whereby the arrow direction corresponds to the direction of conductivity of the diodes.

The circuit of the error logic 11 which may also be constructed differently from the one shown, operates in such a manner that at least (a) with a "1" signal simultaneously and exclusively at the T input and L input, the output of the NOR element 33 carries a "1" signal, (b) with a "1" signal simultaneously at the T input and F input, the output of the AND element 30 carries a "1" signal, (c) with a "1" signal at the T input alone, the output of the AND element 32 carries a "1" signal, and (d) several outputs never carry simultaneously a "1" signal.

The outputs of the AND elements 30 of all circuits of the error logic 11 are interconnected to a common line V, also the outputs of all NOR elements 33 to a common line R and the outputs of all AND elements 32 to a common line U and are uncoupled with respect to each other by way of diodes, not illustrated for the sake of clarity. The common line V leads to the input of an inverter 37, whereby the output of the inverter 37 and the common line R lead to the inputs of an AND element 36. A light diode 35 is connected to the common line V while a light diode 34 is connected to the common line U. The two light diodes 34 and 35 form together the error indication 12 whereas the inverter 37 and the AND element 36 represent the blocking circuit 16. The output of the AND element 36 which, according to FIG. 1, is connected with the pulse transmitter 6, forms the release 17.

The operation of the error logic illustrated in FIG. 2 will now be described hereinafter.

If a conductor or line, for example, the conductor or line 2 is tested, then the coordinated shift register output carries a "1" signal. This "1" signal at first passes by way of the conductor or line 2 to be tested and into the adaptor logic 10. As already described, a test will be made in the adaptor logic 10 whether a "1" signal is present at one of the permitted adaptor connections. If yes, the line L2 also receives a "1" signal. The latter and the original "1" signal by way of the associated synchronizing line T2 are fed to the circuit 28 of the error logic 11. In the presence of these two signals, the output of the NOR element 33 and therewith the common line R also receive a "1" signal as already described. Since the circuit is so constructed that always only one common line can carry a "1" signal, the input of the inverter 37 receives a 0 signal, and the AND element 36 consequently a "1" signal at both inputs so that the output of the AND element 36 also carries a "1" signal which is conducted as release signal to the pulse transmitter 6 for the further shifting of the shift register 5.

A "1" signal in the common line R means that the line is evaluated as "correctly connected" and a release signal takes place. A "1" signal in the common line U and a lighting up of the light diode 34 indicates an interruption or open circuit of the tested line, and a "1" signal in the common line V together with a lighting up of the light diode 35 signals an interchange of the tested line. Which conductor is thereby involved can be recognized from the indication of the counter 8 coupled with the pulse transmitter 6. A short-circuit can finally be recognized in that none of the two light diodes 34 and 35 lights up, but nonetheless the shift register 5 does not continue to be shifted since, as a result of the short-circuit, none of the common lines carries a "1" signal. The entire course of the testing operation was already described hereinabove.

While I have shown and described only one embodiment in accordance with the present invention, it is understood that the same is not limited thereto but is susceptible of numerous changes and modifications as known to those skilled in the art, and I therefore do not wish to be limited to the details shown and described herein but intend to cover all such changes and modifications as are encompassed by the scope of the appended claims.

I claim:

1. An apparatus for testing different cable sets having several conductor means comprising shift register means providing one output each for each individual conductor means, synchronizing line means associated with each individual conductor means, each output of the shift register means being coupled with an input of the associated individual conductor means and an input of the associated synchronizing line means, and means coupled to an output of the individual conductor means and an output of the associated synchronizing line means for indicating proper operation of the individual conductor means in response to the shift register means providing an output to the associated individual conductor means and the associated synchronizing line means for testing of the cable sets, each individual conductor means including at least one of an individual conductor and a group of interconnected conductors, a respective one of the synchronizing line means being associated with each of the individual conductors and with each group of interconnected conductors, the shift register means providing one output for each respective individual conductor and one output for each respective group of interconnected conductors, and wherein each of the group of interconnected conductors is arranged for having an input thereof coupled with the respective output of the shift register means, and further comprising matrix means with one cross-over point for at least each output of each conductor of the group of interconnected conductors, logic gate circuit means being connected with each cross-over point corresponding to a respective group of interconnected conductors for providing an output indicative of proper operation of the group of interconnected conductors.

2. An apparatus for testing different cable sets having several conductor means comprising shift register means providing one output each for each individual conductor means, synchronizing line means associated with each individual conductor means, each output of the shift register means being coupled with an input of the associated individual conductor means and an input of the associated synchronizing line means, and means coupled to an output of the individual conductor means and an output of the associated synchronizing line means for indicating proper operation of the individual conductor means in response to the shift register means providing an output to the associated individual conductor means and the associated synchronizing line means for testing of the cable sets, each individual conductor means including at least one of an individual conductor and a group of interconnected conductors, a respective one of the synchronizing line means being associated with each of the individual conductors and with each group of interconnected conductors, the shift register means providing one output for each respective individual conductor and one output for each respective group of interconnected conductors, and further comprising adaptor logic means for receiving outputs of the conductor means and the synchronizing line means for testing the permissibility of polarities, and error logic means for receiving outputs of the conductor means and synchronizing line means for determining short-circuits, interchanges and open-circuits, and storage means for storing the number of errors determined by the error logic means.

3. An apparatus according to claim 1 or 2 where in the individual conductor means of the cable sets include nonpolarized adaptor means for enabling connection of the individual conductor means, the cable sets being of a type for motor vehicles.

4. An apparatus according to claim 1, wherein the indicating means include test gate means provided for each individual conductor and for each group of interconnected conductors, a respective test gate means receiving at inputs thereof, one of outputs of an associated individual conductor and associated sychronizing line means and outputs of associated logic gate circuit means coordinated with a respective group of interconnected conductors and the associated synchronizing line means, and optical indicating means coordinated to respective inputs of the test gate means, the outputs of the test gate means being operatively coupled with an input of the shift register means.

5. An apparatus according to claim 4, further comprising adaptor logic means for receiving outputs of the conductor means and the synchronizing line means for testing the permissibility of polarities, and error logic means for receiving outputs of the conductor means and synchronizing line means for determining short-circuits, interchanges and open-circuits, and storage means for storing the number of errors determined by the error logic means.

6. An apparatus according to claim 5, further comprising maximum value transmitter means for spot check testing of cable set lots, the maximum value transmitter means being responsive to the error storage means for generating a signal for blocking testing of the cable set lot upon the error storage means exceeding the maximum value of errors.

7. An apparatus according to claim 2, further comprising maximum value transmitter means for spot check testing of cable set lots, the maximum value transmitter means being responsive to the error storage means for generating a signal for blocking testing of the cable set lot upon the error storage means exceeding the maximum value of errors.

8. An apparatus for testing different cable sets having several conductor means comprising shift register means providing one output for each individual conductor means, synchronizing line means associated with each individual conductor means, each output of the shift register means being coupled with an input of the associated individual conductor means and an input of the associated synchronizing line means, and means coupled to an output of the individual conductor means and an output of the associated synchronizing line means for indicating proper operation of the individual conductor means in response to the shift register means providing an output to the associated individual conductor means and the associated synchronizing line means for testing of the cable sets, said means for indicating proper operation including logic error circuit means being provided for each individual conductor means, the logic error circuit means comprising two AND gates and two NOR gates, an output of the individual conductor means being connected to one input of a first NOR gate, and the synchronizing line means associated with the individual conductor means being connected, respectively, to one input of a first and a second AND gate, an external conductor being provided and connected to another input of the second AND gate, the individual conductor means and the external conductor inputs of other individual conductor means being coupled by diodes in such a manner that a predetermined signal at one individual conductor means input passes to all other external conductor inputs other than its associated external conductor input, the second AND gate having an output connected to one input of the second NOR gate and to another input of the first NOR gate, the output of the first NOR gate being connected to the another input of the first AND gate and to the another input of the second NOR gate, the outputs of each logic error circuit means being provided to trunk lines wherein the output of the second NOR gate is coupled to a first trunkline, the output of the first AND gate is coupled to a second trunk line, and the output of the second AND gate is coupled to a third trunk line.

9. An apparatus according to claim 8, wherein logic adaptor circuit means is connected in front of the logic error circuit means for, respectively, two individual conductor means with permissible polarity, the adaptor circuit means comprising an AND gate for each individual conductor means, one input of each AND gate being connected to the output of the associated individual conductor means and another input thereof of at least one of the AND gates being connected to the synchronizing line means associated with individual conductor means or a synchronizing line means having an inverting member in the path thereof and associated with the other of the two individual conductor means, a diode being provided in the conductive direction with respect to the AND gate between the output of the individual conductor means and the input of the associated AND gate, the cathode connections of both diodes being connected together.

10. An apparatus according to claim 9, wherein an error indicator is provided comprising a light emitting diode connected to the second trunk line and a light emitting diode connected to the third trunk line.

11. An apparatus according to claim 10, further comprising a stop circuit connected to the first and third trunk lines, the stop circuit including an AND gate and an inverter, the first trunk line being connected to one input of the AND gate and the third trunk line being connected to the input of the inverter, the output of the inverter being connected to another input of the AND gate, the AND gate providing an output signal for enabling release and automatic shifting of the shift register.

12. An apparatus according to claim 11, wherein the output of each individual conductor means and each synchronizing line means associated therewith is connected to a light emitting diode.

* * * * *